United States Patent
Aoki et al.

(10) Patent No.: US 6,797,648 B2
(45) Date of Patent: Sep. 28, 2004

(54) CLEANING WATER FOR CLEANING A WAFER AND METHOD OF CLEANING A WAFER

(75) Inventors: Hidemitsu Aoki, Tokyo (JP); Hiroaki Tomimori, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 208 days.

(21) Appl. No.: 10/167,442

(22) Filed: Jun. 13, 2002

(65) Prior Publication Data

US 2002/0189639 A1 Dec. 19, 2002

(30) Foreign Application Priority Data

Jun. 13, 2001 (JP) .......................... 2001-179081

(51) Int. Cl.[7] .................. H01L 21/31; H01L 21/469
(52) U.S. Cl. ...................... 438/782; 134/1.3; 134/33
(58) Field of Search ...................... 438/782, 745; 134/1.3, 33

(56) References Cited

U.S. PATENT DOCUMENTS

| | | | | |
|---|---|---|---|---|
| 5,489,557 A | * | 2/1996 | Jolley ........................ | 438/476 |
| 5,501,240 A | * | 3/1996 | Dohku et al. ................ | 134/61 |
| 6,187,210 B1 | * | 2/2001 | Lebouitz et al. ............. | 216/11 |
| 6,517,637 B1 | * | 2/2003 | Fu et al. ...................... | 134/6 |
| 6,589,359 B2 | * | 7/2003 | Kamikawa et al. .......... | 134/26 |
| 2002/0053355 A1 | * | 5/2002 | Kamikawa et al. .......... | 134/30 |
| 2002/0062843 A1 | * | 5/2002 | Hirooka et al. .............. | 134/6 |
| 2002/0102852 A1 | * | 8/2002 | Verhaverbeke et al. ..... | 438/690 |
| 2002/0189639 A1 | * | 12/2002 | Aoki et al. ................... | 134/2 |
| 2002/0189640 A1 | * | 12/2002 | Linn et al. .................... | 134/3 |
| 2003/0066542 A1 | * | 4/2003 | Riggs et al. .................. | 134/2 |
| 2004/0074526 A1 | * | 4/2004 | Aoki et al. ................... | 134/36 |

* cited by examiner

Primary Examiner—Alexander Ghyka
(74) Attorney, Agent, or Firm—Young & Thompson

(57) ABSTRACT

A wafer is rotated while cleaning water is sprayed from a nozzle to the surface of this wafer. The cleaning water is an aqueous solution in which 1 to 2.5 ppm of hydrogen gas is dissolved in water with an additional, small amount of ammonium hydroxide. The cleaning water has a pH of 7.5 to 8.0, an oxidation-reduction potential of −0.6 to −0.45 V, and a resistivity of not greater than 1 MΩ·cm. And the cleaning water is reducing water.

12 Claims, 8 Drawing Sheets

CLEANING WATER FOR CLEANING A WAFER AND METHOD OF CLEANING A WAFER

BACKGROUND OF THE INVENTION

1. Field of the Invention

The invention relates to cleaning water for cleaning a wafer on which semiconductor devices are formed and a method of cleaning a wafer by using this cleaning water. In particular, the invention relates to cleaning water and a method of cleaning a wafer to be used in the final rinse of a wafer.

2. Description of the Related Art

In the fabrication of semiconductor devices, wafer cleaning steps are interposed between individual steps so as to remove particles and traces of impurities adhering to the wafer during the respective steps. With miniaturization of semiconductor devices, the size and concentration of particles in question have become smaller lately. Cleaning technologies are thus of ever-increasing importance. The size of particles in question recently is 0.1 $\mu$m and above, so that control has come to be exercised on particles (dust) of such size. A large amount of particles existing on a wafer can cause detects such as a pattern defect and deteriorate the devices in yield.

FIG. 1 is a perspective view showing a method of cleaning a wafer according to conventional single-wafer spin processing. As shown in FIG. 1, a wafer 1 is rotated while pure water (not shown) is sprayed from a nozzle 2 to the central part of the surface of the wafer 1. The pure water falling on the central part of the surface of the wafer 1 moves toward the rim of the wafer 1 due to centrifugal force resulting from the rotation of the wafer 1. By this movement, the pure water cleans the surface of the wafer 1. Incidentally, the pure water may be referred to as DIW (de-ionized water) or ultra-pure water.

The foregoing conventional technology, however, has the following problems. When pure water is used to clean the wafer 1, thin gate oxide films in the central part of the cleaned wafer 1 may be broken. Given that the wafer 1 is provided with wiring portions exposing large areas of Cu, thin Cu lines drawn from the wiring portions become easier to be eluted as the exposed areas increase. Moreover, particles tend to concentrate on the central part. Furthermore, the periphery of the wafer becomes prone to Cu oxidation or elution. The causes of these problems have been heretofore unknown.

SUMMARY OF THE INVENTION

It is an object of the present invention to provide cleaning water for cleaning a wafer and a method of cleaning a wafer that can avoid the breakdown of gate oxide films and the particle concentration in the central part of the wafer as well as the oxidation and elution of metal films formed on the wafer.

Cleaning water for cleaning a wafer according to the present invention is used for cleaning a wafer in a step of rinsing the wafer in single-wafer spin processing. This cleaning water has a resistivity of not greater than 1 M$\Omega$·cm and a pH of 7.5 to 9, contains ammonium hydroxide, tetramethylammonium hydroxide, or choline, and is reducing water.

According to the present invention, the cleaning water given a resistivity of not greater than 1 M$\Omega$·cm can preclude static electricity from occurring due to friction between the cleaning water and the wafer in the cleaning step of single-wafer spin processing. This makes it possible to avoid the breakdown of gate oxide films formed on the central part of the wafer and the particle concentration on the central part of the wafer that are ascribable to the static electricity. In addition, the cleaning water is made weakly alkaline, or 7.5 to 9 in pH, and is reducing water. This can suppress Cu oxidation and elution. Moreover, containing ammonium hydroxide ($NH_4OH$), tetramethylammonium hydroxide, or choline can make the cleaning water alkaline, and suppress residuals to appear on the wafer when the wafer is cleaned and then dried. Consequently, this cleaning water can be used in the final rinse as a substitute for pure water. In particular, the cleaning water preferably contains ammonium hydroxide which is extremely volatile and the least liable to remain.

Moreover, the cleaning water preferably may have an oxidation-reduction potential of $-0.7$ to $-0.2$ V and contain hydrogen gas of 0.2 to 5 ppm in concentration. This allows a further reduction of the Cu elution. It is yet preferable that the cleaning water falls within a range of $-0.6$ and $-0.45$ V in oxidation-reduction potential and the range of 1 and 2.5 ppm in the concentration of hydrogen gas.

A method of cleaning a wafer according to the present invention is a method of cleaning a wafer in a rinse step of single-wafer spin processing. In this method of cleaning a wafer, the wafer is rotated about an axis perpendicular to a surface of this wafer while cleaning water is sprayed onto the surface of the wafer to clean the surface. This cleaning water has a resistivity of not greater than 1 M$\Omega$·cm and a pH of 7.5 to 9, contains ammonium hydroxide, tetramethylammonium hydroxide, or choline, and is reducing water. Incidentally, the surface of the wafer shall refer to both the side on which semiconductor devices etc. are formed and the side opposite thereto.

According to the present invention, accumulation of charges on the wafer can be suppressed in the step of spin-cleaning the wafer. It is therefore possible to preclude the breakdown of gate oxide films and the concentration of particles in the central part of the wafer. It is also possible to avoid the elution of metal films that constitute the wiring, electrodes, and the like formed on the wafer.

DETAILED DESCRIPTION OF THE PREFERRED EMBODIMENTS

To solve the foregoing problems, the inventors have made intensive experiments and studies, and reached the following findings as to the reasons that the breakdown of gate oxide films in the central part of a wafer, the elution of metal films, and the concentration of particles occur when the wafer is cleaned with pure water.

Figure 1:
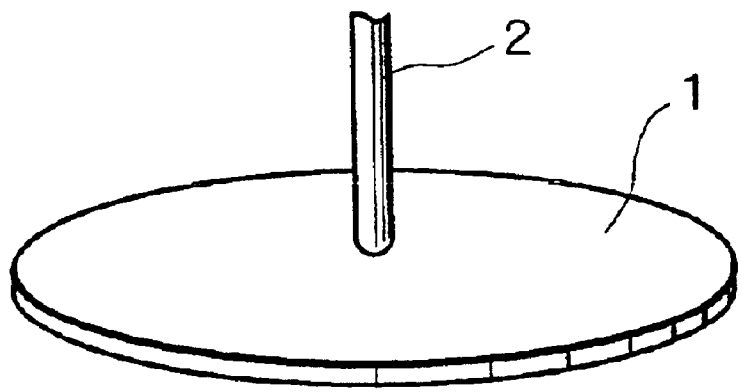
FIG. 1 is a perspective view showing a method of cleaning a wafer according to conventional single-wafer spin processing.

Pure water is a high-resistance substance, having an extremely high resistivity of 18 M$\Omega$·cm. When the surface of the wafer 1 is cleaned with pure water (not shown) as shown in FIG. 1, the friction occurring between the pure water and the wafer 1 then causes static electricity between the pure water and the wafer 1. The pure water is charged positively and the wafer 1 is charged negatively (charge-up). With the central part of the wafer 1 in particular, the pure water undergoes weaker centrifugal force than on the periphery of the wafer 1. The charges caused by the friction resulting from corrosion with the pure water are accumulated locally to the central part of the wafer 1. Thus, the central part of the wafer 1 is negatively charged more intensely than the periphery is. This causes a large difference in potential between the central part and the periphery of the wafer 1.

As a result, thin gate oxide films in the central part of the wafer 1 can suffer dielectric breakdown because of their negative charges. Gate oxide films in these days are as extremely thin as 1.5 to 2.0 nm or so, which means easy breakdown under a slight amount of static electricity. Moreover, since the potential difference occurs between the central part and the periphery of the wafer 1, the elution of Cu and other metal films is facilitated at exposed portions of thin Cu lines that are drawn from wiring portions exposing large areas of Cu. This potential difference also promotes particle concentration on the central part.

The charge-up can be reduced by lowering the resistivity of the cleaning water. For this purpose, an aqueous solution in which $CO_2$ is dissolved to lower the resistivity (hereinafter, referred to as $CO_2$ water) may be used to clean the wafer instead of pure water. Since $CO_2$ water has a resistivity lower than that of pure water, the use of $CO_2$ water causes smaller static electricity between the wafer and the $CO_2$ water. This contributes, to some extent, to the avoidance of such problems as the breakdown of gate oxide films and the concentration of particles stated previously.

Nevertheless, $CO_2$ water is weakly acid, having a pH of the order of 4.0 to 5.5, and hence ionizes Cu when in contact. Consequently, when $CO_2$ water makes contact with the wafer, Cu that constitutes the wiring, electrodes, and the like formed on the wafer can be eluted.

Then, in the present invention, the cleaning water is provided with a resistivity of not greater than 1 M$\Omega$·cm and a pH of 7.5 to 9, and is reducing water. The cleaning water given a resistivity of 1 M$\Omega$·cm or below can prevent the occurrence of static electricity between the cleaning water and the wafer. In addition, the pH 7.5–9 and the cleaning water, which is reducing water, can preclude Cu elution.

Figure 2:
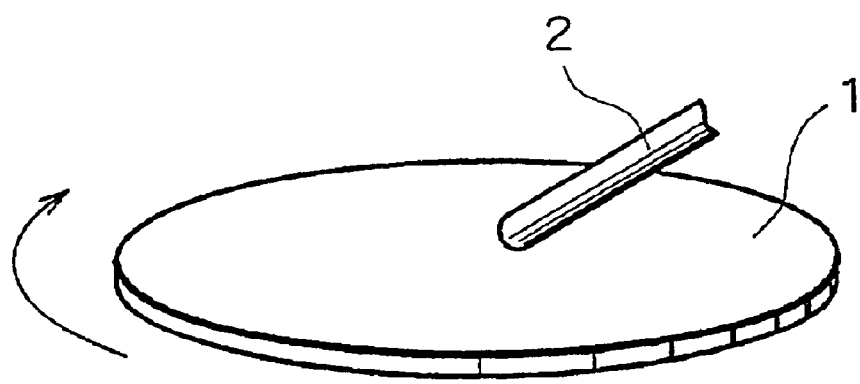
FIG. 2 is a perspective view showing a method of cleaning a wafer according to a first embodiment of the present invention.

Hereinafter, embodiments of the present invention will be described in detail with reference to the accompanying drawings. Initially, description will be given of a first embodiment of the present invention. FIG. 2 is a perspective view showing the method of cleaning a wafer according to the present embodiment. As shown in FIG. 2, in the present embodiment, a wafer 1 is rotated while reducing cleaning water (hereinafter, referred to as reducing water) is sprayed from a nozzle 2 to the central part of the surface of the wafer 1. The wafer 1 is rotated at speed of 200 to 1500 rpm. The nozzle 2 sprays the reducing water (not shown) at a flow rate of 0.5 to 1.5 l/min. Incidentally, the nozzle 2 may extend in a perpendicular direction to the surface of the wafer 1 or may tilt from the perpendicular direction. The nozzle 2 is positioned so that the reducing water falls onto the central part of the wafer 2.

The reducing water is an aqueous solution in which 1 to 2.5 ppm of hydrogen gas is dissolved in water with an additional, small amount of ammonium hydroxide ($NH_4OH$). The reducing water has a pH of 7.5 to 8.0, an oxidation-reduction potential (ORP) of −0.6 to −0.45 V, and a resistivity of not greater than 1 M$\Omega$·cm. The reducing water can be obtained, for example, by electrolyzing water to collect cathode water from the cathode side and adding ammonium hydroxide to this cathode water. Otherwise, ammonium hydroxide may be added to pure water so that the aqueous solution is electrolyzed to collect the reducing water from the cathode side. Hydrogen evolved from the cathode side may be exclusively collected, in which case this hydrogen is dissolved into water in another module to create hydrogen water. Then, ammonium hydroxide is added to this hydrogen water to obtain the reducing water.

The reducing water emitted from the nozzle 2 to fall on the central part of the surface of the wafer 1 moves toward the rim of the wafer 1 due to centrifugal force resulting from the rotation of the wafer 1. By this movement, the reducing water cleans the surface of the wafer 1.

Subsequently, the supply of the reducing water is stopped and the surface of the wafer 1 is spin-dried. The spin drying is performed using $N_2$ gas or $CO_2$ gas. To spin-dry the wafer 1, the chamber in which the wafer 1 has been cleaned may be used as is, in which case the wafer 1 is rotated with the supply of the reducing water stopped so that the centrifugal force resulting from rotation of the wafer 1 removes the reducing water from the surface of the wafer 1 to dry. Alternatively, the wafer 1 may be transferred into a chamber dedicated to drying. According to the former method, the step of transferring the wafer 1 into another chamber can be omitted for effective drying of the wafer 1. According to the latter method, the drying can be performed in an atmosphere free of the chemicals used in cleaning. The chemicals can thus be surely precluded from adhering to the wafer again during the drying.

In the method of cleaning a wafer according to the present embodiment, the reducing water has is lower than or equal to 1 M $\Omega$·cm in resistivity. It is therefore possible to prevent static electricity from occurring due to the friction between the reducing water and the wafer 1. This makes it possible to avoid dielectric breakdown of gate oxide films formed on the central part of the wafer 1 and particle concentration on the central part of the wafer 1.

In addition, since the reducing water has a pH of 7.5 to 8.0, oxidation and elution can be suppressed of Cu that constitutes the wiring, electrodes, and the like formed on the surface of the wafer 1.

Figure 3:
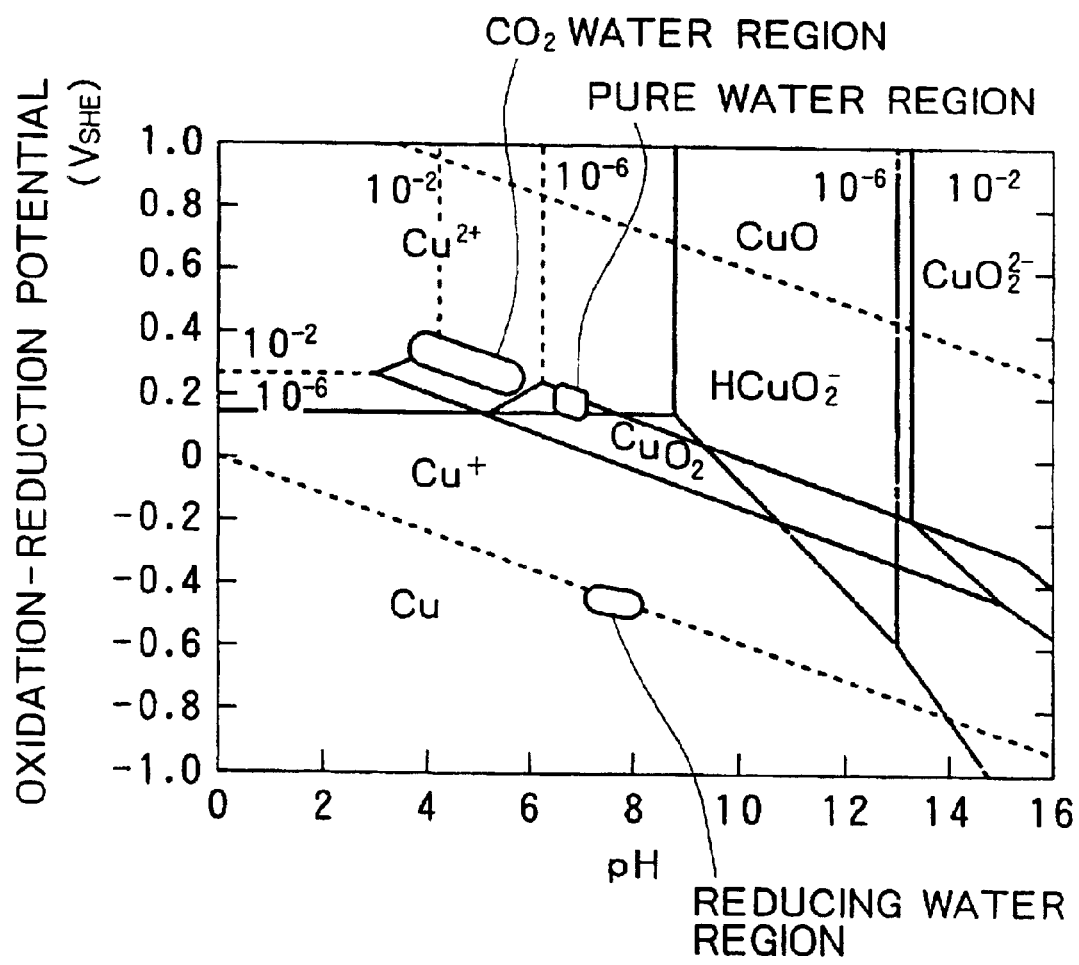
FIG. 3 is a potential-pH diagram of Cu-aqueous-solution systems showing the states of Cu in aqueous solutions, where the abscissa represents the pH of the aqueous solution and the ordinate represents the oxidation-reduction potential.

Hereinafter, description will be given in detail of the relation between the state of the reducing water and the elution of Cu. FIG. 3 is a potential-pH diagram of Cu-aqueous-solution systems showing the states of Cu in aqueous solutions, where the abscissa represents the pH of the aqueous solution and the ordinate represents the oxidation-reduction potential. As shown in FIG. 3, Cu in an aqueous solution becomes more likely to be ionized when the solution has a pH of not higher than 7 and an oxidation-reduction potential of not lower than 0 V, or is acid and in an oxidative atmosphere. Pure water has a pH of approximately 7 and an oxidation-reduction potential of approximately 0.2 V. Cu in pure water falls within the $Cu^{2+}$ region, having a weak propensity for ionization. $CO_2$ water has a pH of 4 to 6 and an oxidation-reduction potential of the order of 0.25 to 0.4 V. Cu in $CO_2$ water falls within the $Cu^{2+}$ region, and is ionized more strongly for elution than in pure water. In contrast, the reducing water used in the present embodiment has a pH of 7.5 to 8.0 and an oxidation-reduction potential of −0.6 to −0.45 V. Cu in the reducing water then falls within the Cu region with no propensity for ionization. That is, Cu exists as a substance, not being eluted into the reducing water.

Moreover, in the present embodiment, ammonium hydroxide is added to the reducing water for the sake of pH adjustment. Ammonium hydroxide is highly volatile and hence yields no residuals that may affect the processes of subsequent steps. Consequently, the reducing water in the present embodiment can be used in the final rinse step as a substitute for pure water.

Now, there has conventionally been the problem that the elution of Cu occurs easily on the periphery of a wafer even though the wafer is cleaned with pure water. The inventors have found out through experiments and studies that the pure water emitted absorbs oxygen and carbon dioxide from the atmosphere and changes into $CO_2$ water on the way from the central part to the rim of the wafer. This change is responsible for the easy Cu elution on the wafer periphery. The time for the pure water to move from the central part to the rim of the wafer is 0.1 to 1 second or so. Since the electrodes and wiring made of Cu are extremely thin, however, the Cu elution ascribable to the change of the pure water into $CO_2$ water can cause practical problems. On the other hand, in the embodiment, the reducing agent of the reducing water prevents the reducing water from changing into oxidative easily even if the reducing water absorbs oxygen and carbon dioxide from the atmosphere on the way from the central part to the rim of the wafer. Consequently, it is possible to inhibit Cu from being eluted into the cleaning water and being oxidized due to the fact that the cleaning water absorbs oxygen and carbon dioxide from the atmosphere to be oxidative as is seen with pure water.

While the present embodiment deals with the case where ammonium hydroxide is added to make the reducing water weakly alkaline, ammonium hydroxide may be replaced with other additives as long as the additives make the reducing water weakly alkaline and yield no residual after drying. For example, tetramethylammonium hydroxide or choline may be added.

Hereinafter, description will be given of the reasons for the numerical limits on the constituents of the present invention.

Resistivity of Cleaning Water: Not Greater than 1 MΩ·cm

At resistivities above 1 MΩ·cm, the cleaning water decreases in conductivity. As a result, the friction between the wafer and the cleaning water can charge up the cleaning water positively and the wafer negatively. In particular, the cleaning water resides longer in the central part of the wafer, which is thus charged more intensely than the periphery is. This creates a potential difference between the central part and the periphery of the wafer. As stated previously, there occur the dielectric breakdown of gate oxide films, the concentration of particles, and the elution of metal films accordingly. Hence, the resistivity of the cleaning water is limited to 1 MΩ·cm or below.

pH of Cleaning Water: 7.5 to 9

At pHs below 7.5, the cleaning water decreases in conductivity. On the other hand, at pHs above 9, the cleaning water becomes so rich in ammonium hydroxide that residuals appear on the wafer after the cleaning. A pH of 9 minimizes the amount of elution of Cu, while pHs above 9 promotes the Cu elution. Hence, the pH of the cleaning water is confined to between 7.5 and 9. The range of 7.5 and 8 is preferable.

Oxidation-reduction Potential of Cleaning Water: −0.7 to −0.2 V

When the cleaning water exceeds −0.2 V in oxidation-reduction potential, Cu in the cleaning water becomes prone to ionization. On the other hand, the oxidation-reduction potential is hard to lower below −0.7 V because of the limit on the amount of hydrogen gas dissolvable into water. Thus, the cleaning water preferably has an oxidation-reduction potential of −0.7 to −0.2 V. The range of −0.6 and −0.45 V is yet preferable.

Concentration of Hydrogen Gas in Cleaning Water: 0.2 to 5 ppm

When the concentration of hydrogen gas in the cleaning water falls below 0.2 ppm, the cleaning water is not so reducing water as to suppress Cu ionization sufficiently. On the other hand, it is hard to dissolve hydrogen gas into water beyond 5 ppm even under pressure. Hence, the cleaning water preferably contains hydrogen gas of 0.2 to 5 ppm in concentration. The cleaning water becomes sufficiently reducing water when the concentration of hydrogen gas in the cleaning water reaches or exceeds 1 ppm. In addition, the maximum concentration of hydrogen gas dissolvable into water is 2.5 ppm unless under pressure. Consequently, the concentration of hydrogen gas in the cleaning water yet preferably falls within the range of 1 and 2.5 ppm.

Number of Revolutions of Wafer: 20 to 4000 rpm

When the wafer is rotated at speed below 20 rpm, the flow rate of the cleaning water on the wafer decreases to lower the cleaning efficiency. On the other hand, if the wafer is rotated at speed above 4000 rpm, the cleaning water resides on the wafer so short that the cleaning efficiency also drops. Hence, the wafer is preferably rotated at speed of 20 to 4000 rpm. The range of 200 and 1500 rpm is yet preferable.

Flow Rate of Cleaning Water: 0.2 to 5 l/min

When the cleaning water falls below 0.2 l/min in flow rate, the cleaning efficiency drops. On the other hand, when the cleaning water exceeds 5 l/min in flow rate, the cleaning efficiency reaches saturation relative to the flow rate of the cleaning water. Hence, the cleaning water preferably falls within the range of 0.2 and 5 l/min in flow rate. The range of 0.5 and 1.5 l/min is yet preferable.

Figure 4:
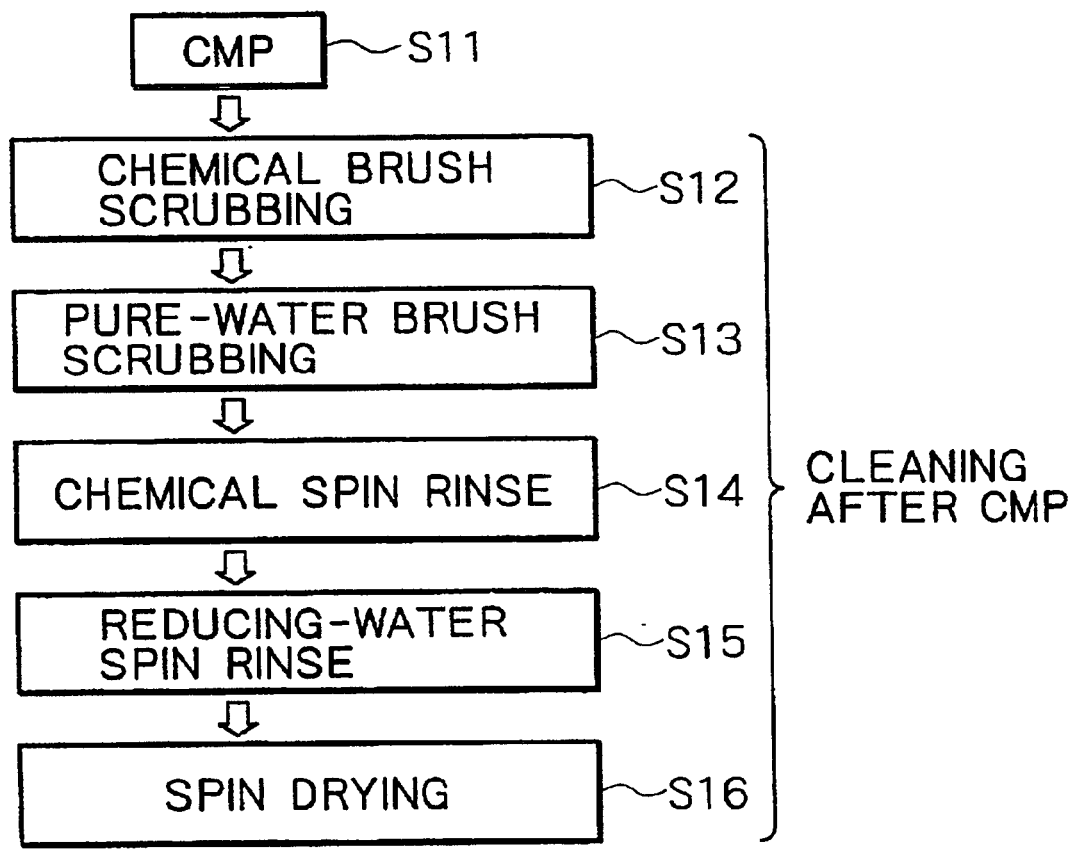
FIG. 4 is a flowchart showing the steps according to a second embodiment of the present invention.

Now, description will be given of a second embodiment of the present invention. FIG. 4 is a flowchart showing the steps of the present embodiment. As shown in FIG. 4, the present embodiment provides an example where the method of cleaning a wafer according to the present invention is applied to the cleaning step after chemical mechanical polishing (CMP). Initially, as shown at step S11 in FIG. 4, a wafer is planarized at the surface by CMP. Then, as shown at step S12, the surface of this wafer is subjected to brush scrubbing using chemicals. Next, as shown at step S13, brush scrubbing is performed with pure water. Here, the brush scrubbing may be performed with reducing water. Next, as shown at step S14, the wafer is rotated while chemicals are sprayed onto the central part of the wafer surface for chemical spin rinse. Next, as shown at step S15, spin rinse is performed using the reducing water to remove the chemicals used at step S14. Subsequently, as shown at step S16, this wafer is spin-dried. The composition of the reducing water and the processes shown at steps S15 and S16 are the same as with the step of cleaning a wafer according to the foregoing first embodiment. The use of this method can suppress the static-based breakdown of gate oxide films, concentration of particles, and elution of Cu in the cleaning steps after CMP.

Figure 5:
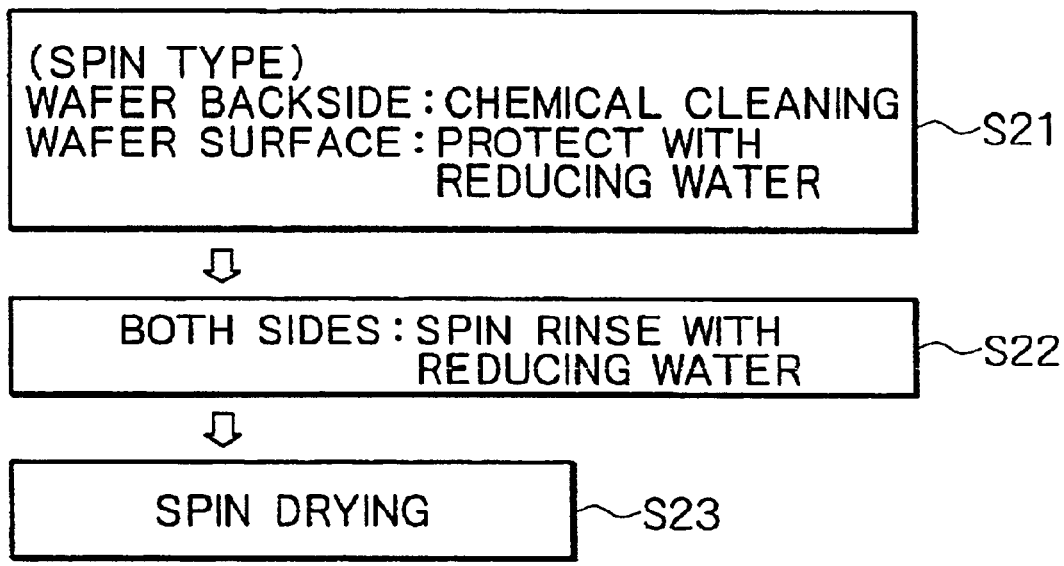
FIG. 5 is a flowchart showing the steps according to a third embodiment of the present invention.

Now, description will be given of a third embodiment of the present invention. FIG. 5 is a flowchart showing the steps of the present embodiment. As shown in FIG. 5, the present embodiment provides an example where the method of cleaning a wafer according to the present invention is applied to wafer backside cleaning. Initially, as shown at step S21, a wafer is spun while chemicals are sprayed onto the backside of the wafer for cleaning. This wafer backside cleaning is typically conducted for such purposes as the removal of metal contamination and particle contamination. In the meantime, the reducing water is sprayed onto the surface of the wafer to protect the wafer surface. This wafer protection is intended to prevent splashes of the chemicals from adhering to the wafer surface and to protect the atmosphere over the wafer surface. Next, as shown at step S22, the reducing water is sprayed onto the surface and backside of the wafer for spin rinse. This removes the chemicals from the backside. Subsequently, as shown at step S23, the wafer is spin-dried. The method of protecting the surface at step S21, the method of rinsing the surface and backside at step S22, and the method of spin drying at step S23 are the same as with the method of cleaning a wafer shown in the foregoing first embodiment. According to the present embodiment, it is possible to clean the backside of the wafer while preventing the surface of the wafer from contamination with the chemicals. It is also possible to suppress the static-based breakdown of gate oxide films, concentration of particles, and elution of Cu in the rinse step after the backside cleaning.

Figure 6:
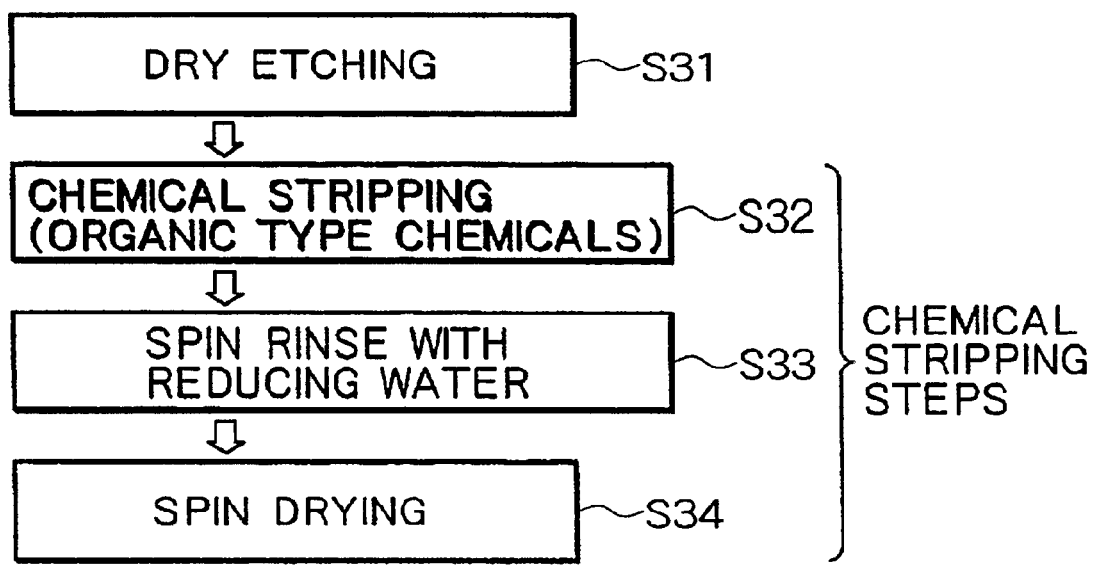
FIG. 6 is a flowchart showing the steps according to a fourth embodiment of the present invention.

Now, description will be given of a fourth embodiment of the present invention. FIG. 6 is a flowchart showing the steps of the present embodiment. As shown in FIG. 6, the present embodiment provides an example where the method of cleaning a wafer according to the present invention is applied to the cleaning step after an organic stripping step of stripping organic films from the surface of a wafer. Incidentally, the examples of the organic films include resists and anti-reflection films. Initially, as shown at step S31 in FIG. 6, the surface of a wafer provided with organic films such as a resist is subjected to dry etching. Then, as shown at step S32, the organic films on the wafer surface are stripped by using organic type chemicals. Given that the chemicals are amine type organic strippers, batch spray type stripping systems are often used. When the chemicals are fluorine type organic strippers, single-wafer spin type stripping systems are used frequently. Under present circumstances, the latter are used more often. Next, as shown at step S33, the wafer is rotated while the reducing water is sprayed onto the surface for spin rinse. This removes the organic type chemicals. Next, as shown at step S34, the wafer is spin-dried. The cleaning method shown at step S33 and the spin dry method shown at step S34 are the same as with the foregoing first embodiment. According to the present embodiment, the breakdown of gate oxide films, the concentration of particles, and the elution of Cu can be avoided in the rinse step after the chemical stripping on the wafer surface.

Figure 7:
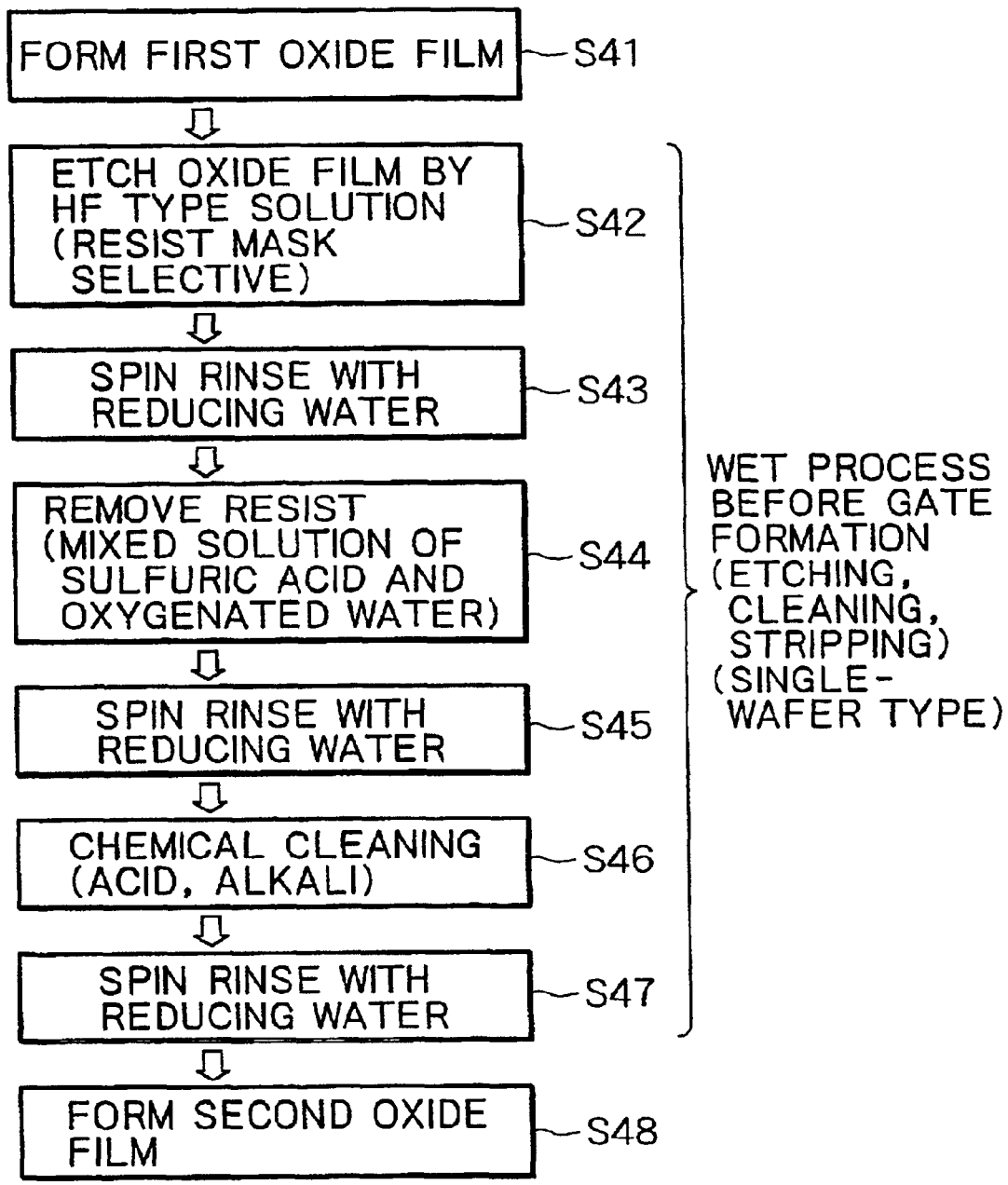
FIG. 7 is a flowchart showing the steps according to a fifth embodiment of the present invention.

Now, description will be given of a fifth embodiment of the present invention. FIG. 7 is a flowchart showing the steps of the present embodiment. As shown in FIG. 7, the present embodiment provides an example where the method of cleaning a wafer according to the present invention is applied to the cleaning steps in a wet process for forming multi-oxide gate oxide films on a wafer surface. Initially, as shown at step S41, a first oxide film having a thickness of, e.g., 3.0 nm is formed on the surface of a wafer. Next, as shown at step S42, a resist is formed on this first oxide film. With this resist as a mask, the first oxide film is etched by an HF type solution to remove the first oxide film selectively. Next, as shown at step S43, the wafer is rinsed with the reducing water to remove the HF type solution. This rinse step includes a spin dry step, being performed by the same methods as those of the spin cleaning step and spin dry step seen in the foregoing first embodiment.

Subsequently, as shown at step S44, the resist is removed by using a mixed solution of sulfuric acid and oxygenated water. Next, as shown at step S45, the wafer is rinsed with the reducing water to remove the mixed solution of sulfuric acid and oxygenated water. This rinse step includes a spin dry step, being performed by the same methods as those of the spin cleaning step and spin dry step seen in the foregoing first embodiment. Next, as shown at step S46, the wafer is cleaned with acid or alkaline chemicals. Next, as shown at step S47, the wafer is rinsed with the reducing water to remove the chemicals. This rinse step includes a spin dry step, being performed by the same methods as those of the spin cleaning step and spin dry step seen in the foregoing first embodiment. Subsequently, as shown at step S48, a second oxide film is formed to a thickness of, e.g., 2.0 nm. Consequently, multi-oxide gate oxide films can be formed on the wafer. According to the present embodiment, the static-based concentration of particles can be suppressed in the cleaning steps during the formation of multi-oxide gate oxide films on the wafer surface.

Figure 8:
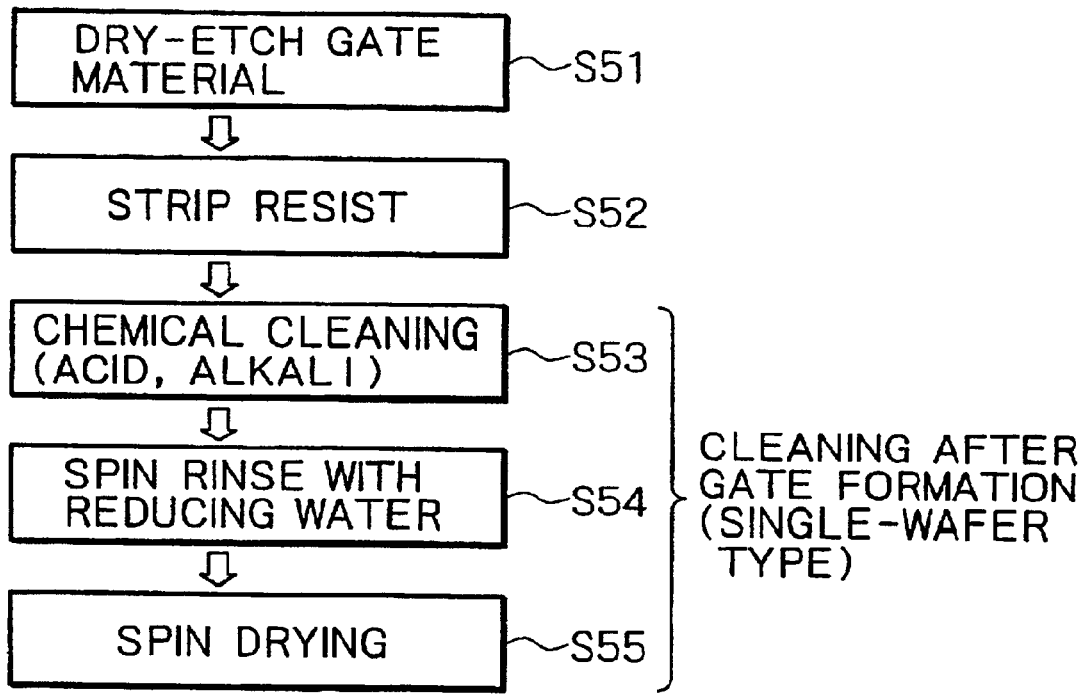
FIG. 8 is a flowchart showing the steps according to a sixth embodiment of the present invention.

Now, description will be given of a sixth embodiment of the present invention. FIG. 8 is a flowchart showing the steps of the present embodiment. As shown in FIG. 8, the present embodiment provides an example where the method of cleaning a wafer according to the present invention is applied to the cleaning step after the formation of gate electrodes on a wafer. Initially, as shown at step S51, a resist having a predetermined pattern is formed on a wafer. With this resist as a mask, a gate electrode layer is dry-etched. Next, as shown at step S52, the resist is stripped. Next, as shown at step S53, the wafer surface is chemically cleaned with acid or alkali chemicals by using a single-wafer type cleaning system. Next, as shown at step S54, the reducing water is sprayed onto the wafer surface for spin rinse, thereby removing the chemicals. Next, as shown at step S55, the wafer is spin-dried. The method of spin-rinsing the wafer at step S54 and the spin dry method shown at step S55 are performed as in the foregoing first embodiment. According to the present embodiment, it is possible to suppress the static-based concentration of particles and elution of Cu in the cleaning step after the formation of gate electrodes.

Figure 9:
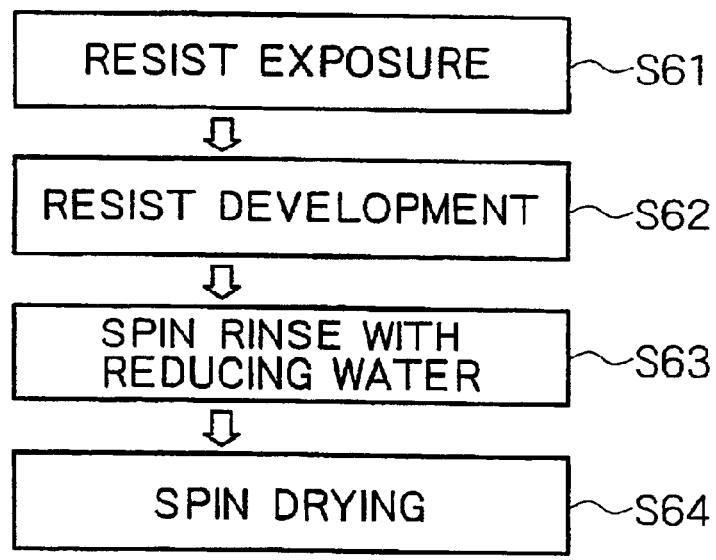
FIG. 9 is a flowchart showing the steps according to a seventh embodiment of the present invention.

Now, description will be given of a seventh embodiment of the present invention. FIG. 9 is a flowchart showing the steps of the present embodiment. As shown in FIG. 9, the present embodiment provides an example where the method of cleaning a wafer according to the present invention is applied to the cleaning step after resist development. Initially, as shown at step S61, a resist having a predetermined pattern is formed on a wafer, followed by resist exposure. Next, as shown at step S62, the resist is developed with a predetermined developer to form a predetermined pattern. Next, as shown at step S63, the reducing water is sprayed onto the wafer surface for spin rinse, thereby removing the developer. Next, as shown at step S64, the wafer is spin-dried. The method of spin-rinsing the wafer at step S63 and the spin dry method shown at step S64 are the same as those of the foregoing first embodiment. According to the present embodiment, particle concentration and Cu elution can be suppressed in the cleaning step after resist development.

Hereinafter, effects of the present invention will be described in the concrete with reference to a wafer that was cleaned by an embodied method of the present invention. Comparison will also be made with comparative examples that are not covered by the scope of the claims of the invention. Initially, three 200 mm-diameter wafers, each having Cu wiring and a thermal oxidation film of approximately 100 nm in thickness on the surface, were prepared. The wafers were then spin-cleaned. Here, one of the wafers was spin-cleaned with pure water. Another was spin-cleaned with $CO_2$ water. The other was spin-cleaned with the reducing water described in the foregoing first embodiment. Subsequently, these wafers were spin-dried. The steps of spin-cleaning and spin-drying the three wafers were performed under the same conditions as those seen in the foregoing first embodiment except the types of the cleaning water.

Figure 10:
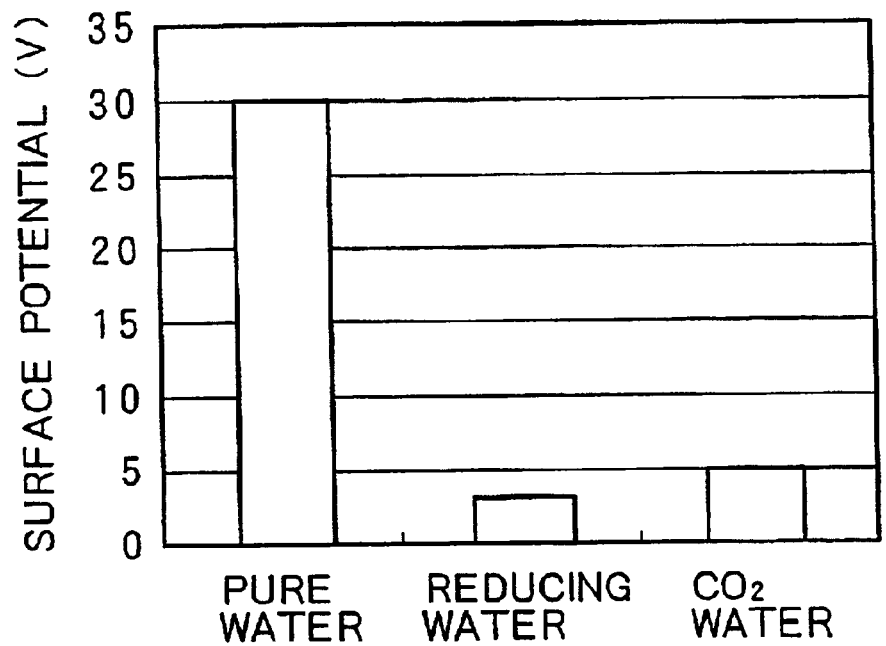
FIG. 10 is a graph showing the surface potentials of wafers with the type of the cleaning water on the abscissa and the maximum surface potential on the ordinate.

Next, the spin-dried wafers were measured for surface potentials. FIG. 10 is a graph showing the surface potentials of the respective wafers with the type of the cleaning water on the abscissa and the maximum surface potential on the ordinate. Incidentally, surface potentials depend on the thicknesses of the oxide films. The surface potentials shown in FIG. 10 are for situations where a thermal oxidation film of approximately 100 nm in thickness is formed on the wafer surface. The charges on the wafers are negative, whereas FIG. 10 shows them in positive values. As shown in FIG. 10, the wafer cleaned with pure water showed the highest surface potential of approximately 30 V. The wafer cleaned with $CO_2$ water had a surface potential of approximately 5 V, lower than the case where pure water was used. The wafer cleaned with the reducing water showed a surface potential yet lower than that of the wafer cleaned with $CO_2$ water.

Figure 11A:
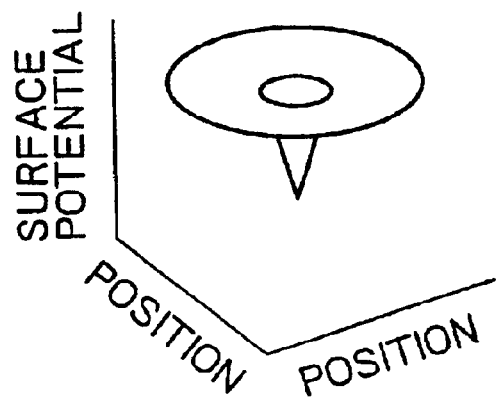
FIGS. 11A and 11B are graphs showing the measurements of surface potential distributions over cleaned wafers, where the X-and Y-axes represent positions on the wafer surface and the Z-axis the surface potential, FIG. 11A showing the surface potential distribution over a wafer cleaned with pure water, FIG. 11B showing the surface potential distribution over a wafer cleaned with the reducing water.
Figure 11B:
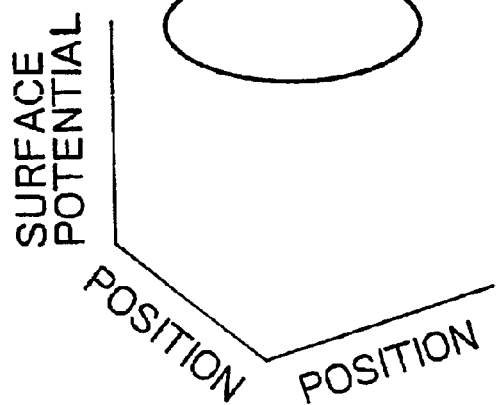

FIGS. 11A and 11B are graphs showing the measurements of surface potential distributions over cleaned wafers, where the abscissas or X- and Y-axes represent positions on the wafer surface and the ordinate or Z-axis the surface potential. FIG. 11A shows the surface potential distribution over the wafer cleaned with pure water. FIG. 11B shows the surface potential distribution over the wafer cleaned with the reducing water. As shown in FIG. 11A, the spin cleaning with pure water created a low-potential region in the central part of the wafer. In contrast, as shown in FIG. 11B, the spin cleaning with the reducing water made the wafer uniform in surface potential all over the surface.

Figure 12:
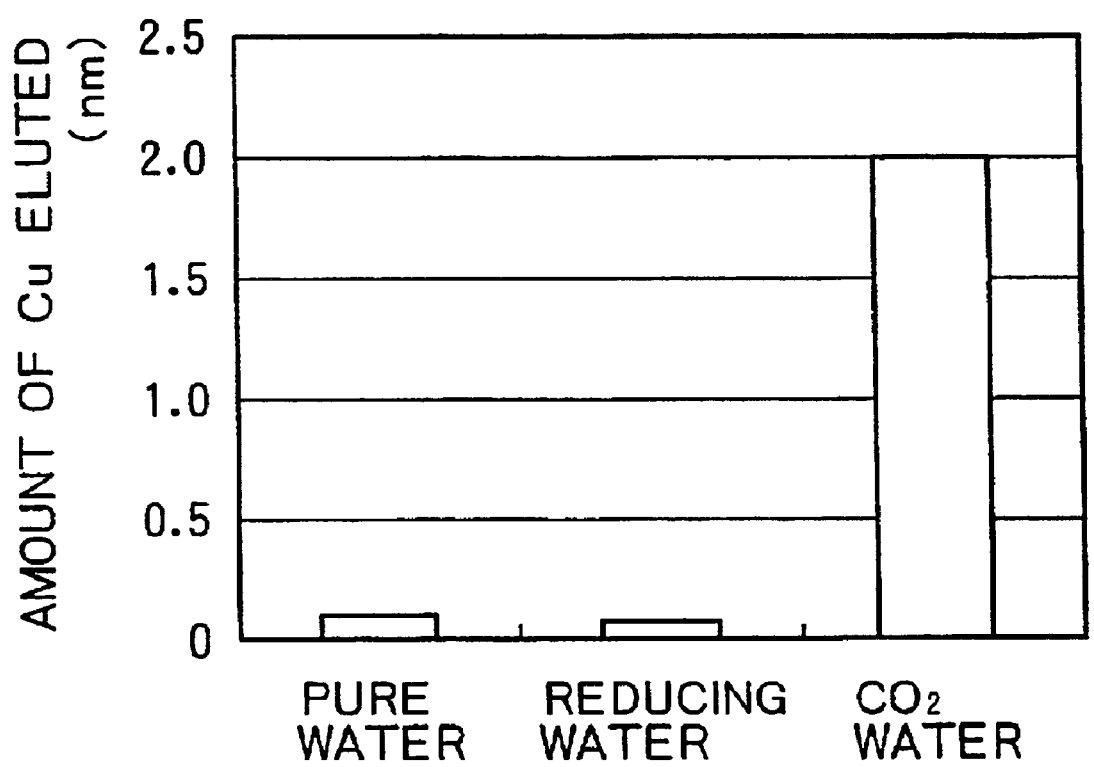
FIG. 12 is a graph showing the amounts of Cu eluted in spin cleaning, with the type of the cleaning water on the abscissa and the decrease in the thickness of the Cu wiring on the ordinate.

The amounts of Cu eluted during the spin cleaning were also measured. FIG. 12 is a graph showing the amounts of Cu eluted during the spin cleaning, with the type of the cleaning water on the abscissa and the decrease in the thickness of the Cu wiring on the ordinate. As shown in FIG. 12, the amount of Cu eluted during the spin cleaning with the reducing water was approximately 1/20 for the case of $CO_2$ water and approximately 1/2 for the case of pure water.

What is claimed is:

1. A method of cleaning a wafer in a rinse step of single-wafer spin processing, comprising the step of rotating a wafer about an axis perpendicular to a surface of said wafer while spraying cleaning water onto the surface of said wafer to clean the surface, said cleaning water having a resistivity of not greater than 1 MΩ·cm and a pH of 7.5 to 9, containing ammonium hydroxide, tetramethylammonium hydroxide, or choline, and being reducing water.

2. The method of cleaning a wafer according to claim 1, wherein said cleaning water has an oxidation-reduction potential of −0.7 to −0.2 V.

3. The method of cleaning a wafer according to claim 1, wherein said cleaning water contains hydrogen gas of 0.2 to 5 ppm in concentration.

4. The method of cleaning a wafer according to claim 1, wherein said wafer is rotated at speed of 20 to 4000 rpm.

5. The method of cleaning a wafer according to claim 1, wherein said cleaning water falls within 0.2 and 5 l/min in flow rate.

6. The method of cleaning a wafer according to claim 1, wherein said wafer cleaned with said cleaning water is spin-dried.

7. The method of cleaning a wafer according to claim 1, wherein said method of cleaning a wafer is a method of cleaning a wafer after said wafer is planarized at the surface by CMP, and is preceded by the steps of:
  planarizing said wafer by CMP;
  cleaning said planarized wafer by brush scrubbing using a chemical;
  cleaning said wafer by brush scrubbing using pure water or said cleaning water; and
  cleaning said wafer further by spin rinse using a chemical.

8. The method of cleaning a wafer according to claim 1, wherein said method of cleaning a wafer is a method for surface protection in a backside cleaning step of said wafer, and is applied to the surface of said wafer while a backside of said wafer is cleaned with a chemical.

9. The method of cleaning a wafer according to claim 1, wherein said method of cleaning a wafer is a method of cleaning after an organic stripping step of stripping an organic film from the surface of said wafer, and is preceded by the steps of:
  dry-etching said wafer given an organic film at the surface; and
  stripping said organic film from said dry-etched wafer by using an organic type chemical.

10. The method of cleaning a wafer according to claim 1, wherein said method of cleaning a wafer is a method of cleaning in forming a multi-oxide gate oxide film on the surface of said wafer, and is at least one of first to third rinses in a step of forming said multi-oxide gate oxide film, the step comprising the steps of:
  forming a first oxide film on the surface of said wafer;
  forming a resist on said first oxide film;
  wet-etching said first oxide film with said resist as a mask so that said first oxide film is removed selectively;
  applying said first rinse to said wafer;

removing said resist;

applying said second rinse to said wafer;

cleaning said wafer with an acid or alkaline chemical;

applying said third rinse to said wafer to remove said chemical; and forming a second oxide film.

11. The method of cleaning a wafer according to claim 1, wherein said method of cleaning a wafer is a method of cleaning after formation of a gate electrode on the surface of said wafer, and is preceded by the steps of:

forming a resist on said wafer and dry-etching a gate electrode layer with said resist as a mask to form said gate electrode;

stripping said resist from said wafer; and cleaning said wafer with an acid or alkaline chemical.

12. The method of cleaning a wafer according to claim 1, wherein said method of cleaning a wafer is a method of cleaning after development of a resist formed on said wafer, and is preceded by the steps of:

forming a resist on said wafer;

exposing said resist formed; and developing said resist exposed.

* * * * *